(12) United States Patent
Benedict et al.

(10) Patent No.: US 12,402,251 B2
(45) Date of Patent: Aug. 26, 2025

(54) POWER VIA RESONANCE SUPPRESSION

(71) Applicant: Hewlett Packard Enterprise Development LP, Houston, TX (US)

(72) Inventors: Melvin Kent Benedict, Magnolia, TX (US); Chi Kim Sides, Spring, TX (US); Paul Danna, Pearland, TX (US); Michael Chan, Bellaire, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 199 days.

(21) Appl. No.: 17/949,732

(22) Filed: Sep. 21, 2022

(65) Prior Publication Data
US 2024/0098898 A1 Mar. 21, 2024

(51) Int. Cl.
*H05K 1/11* (2006.01)
*H05K 3/40* (2006.01)

(52) U.S. Cl.
CPC .......... *H05K 1/115* (2013.01); *H05K 3/4038* (2013.01); *H05K 2201/09545* (2013.01); *H05K 2203/0207* (2013.01)

(58) Field of Classification Search
CPC ...... H05K 1/115; H05K 1/0216; H05K 1/113; H05K 1/0298; H05K 2201/09545; H05K 1/0251; H05K 3/4038; H05K 2203/0207; H05K 1/116; H05K 3/429
See application file for complete search history.

(56) References Cited

U.S. PATENT DOCUMENTS

| | | | |
|---|---|---|---|
| 7,045,719 B1 * | 5/2006 | Alexander | H05K 1/116 174/262 |
| 10,925,162 B1 * | 2/2021 | Hsu | H05K 1/0265 |
| 2006/0055022 A1 * | 3/2006 | Nelson | H01L 23/49827 257/E23.079 |
| 2009/0200074 A1 * | 8/2009 | Douriet | H05K 1/113 174/265 |
| 2011/0267783 A1 * | 11/2011 | Mutnury | H05K 1/024 174/266 |
| 2019/0289710 A1 * | 9/2019 | Kumar | G06F 13/4282 |
| 2024/0080978 A1 * | 3/2024 | Farkas | H05K 3/0047 |

\* cited by examiner

*Primary Examiner* — Timothy J Thompson
*Assistant Examiner* — Paramita Ghosh
(74) *Attorney, Agent, or Firm* — Yao Legal Services, Inc.

(57) ABSTRACT

One aspect provides a printed circuit board (PCB). The PCB can include a plurality of layers and a plurality of plated through-hole (PTH) vias extending through the plurality of layers. The plurality of layers can include at least a top layer for mounting components, a second surface layer, and a first power layer positioned between the top layer and the second surface layer. The plurality of PTH vias can include at least one power via coupled to the first power layer to provide power to components mounted on the top layer. A stub length of the power via can be less than a distance between the power layer and the second surface layer.

8 Claims, 9 Drawing Sheets

POWER VIA RESONANCE SUPPRESSION

BACKGROUND

Field

This disclosure is generally related to design and fabrication of printed circuit boards (PCBs). More specifically, this disclosure is related to reducing coupled noise induced by resonance from power via stub into nearby signals routed underneath an integrated circuit device on a PCB.

Related Art

As the bandwidth of interconnect systems in modern computer systems increases, feature sizes within the PCB structure may approach the effective wavelength of signals propagating along high-bandwidth channels. The reduction in signal wavelength can lead to the formation of parasitic structures and, consequently, parasitic resonances.

A particular type of parasitic structure in a multilayer PCB can be the stub of a power via. More particularly, the length of the power via stubs can be comparable to the thickness of the multilayer PCB, and the corresponding resonance frequencies may fall within the spectrum of signals propagating along the high-speed signal traces on the PCB. When excited by energy in the system, resonance signals in the power vias may enter adjacent signal traces, thus degrading the signal performance.

BRIEF DESCRIPTION OF THE FIGURES

In the figures, like reference numerals refer to the same figure elements.

DETAILED DESCRIPTION

Figure 1:
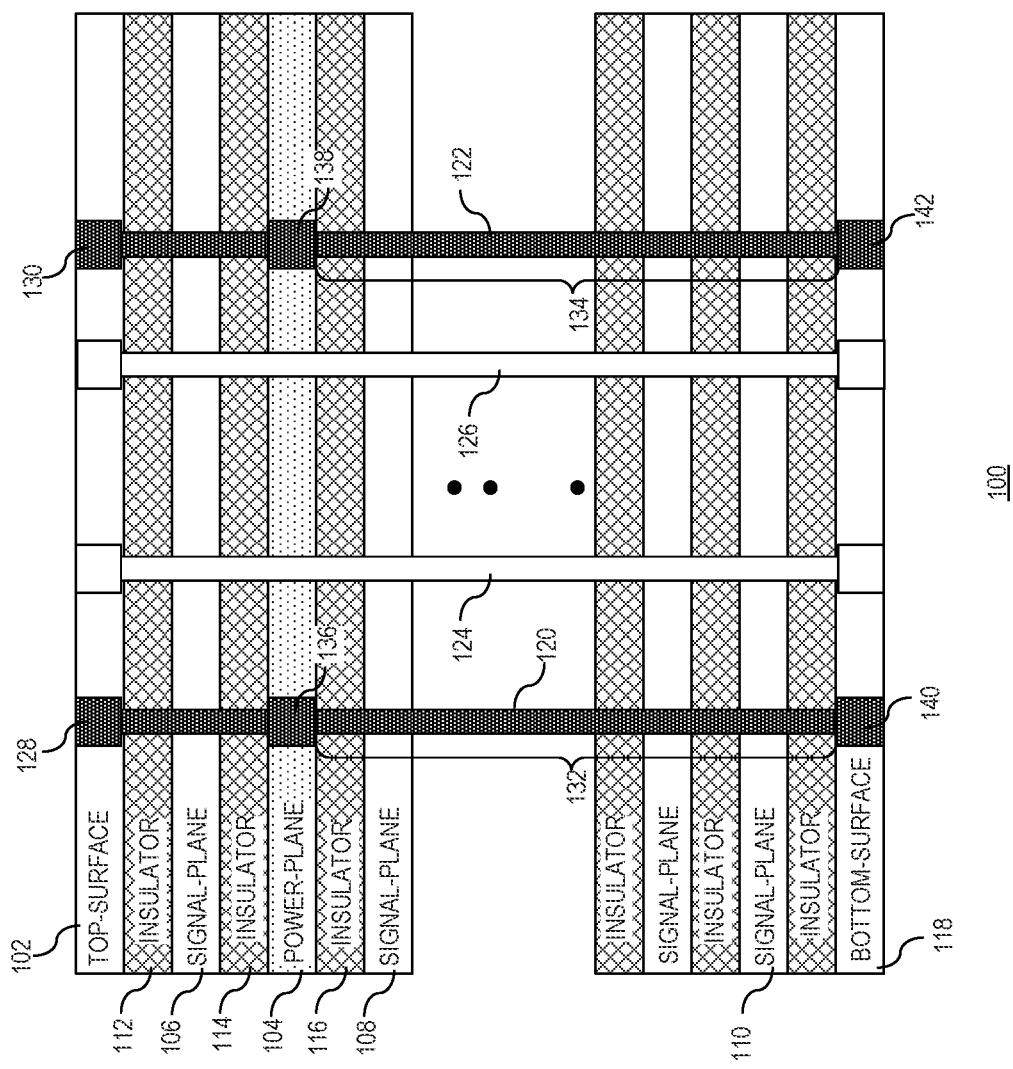
FIG. 1 illustrates a cross-sectional view of a multilayer PCB comprising a number of power vias, according to one aspect.

The following description is presented to enable any person skilled in the art to make and use the embodiments and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the scope of the present disclosure is not limited to the embodiments shown but is to be accorded the widest scope consistent with the principles and features disclosed herein.

Power vias play an important role in multilayer printed circuit boards (PCBs). A power via typically can be a plated through-hole (PTH) via (i.e., a via that passes through all layers of the multilayer PCB). A power via can deliver power from a power plane (i.e., a flat plane of a conductive material such as copper connected to a power supply) to components mounted on a different layer. A power plane can also be simply referred to as a power layer. For example, the power plane can be on an inner layer and the components which consume power can be mounted on the top layer. Power can be routed to a component through the power via and a trace providing an electrical path between the power via and the component. Like other PTH vias, a power via can have a via stub, which is the part of the power via that is not used for delivering power. In general, power planes representing a particular power rail in a multilayer PCB may not be placed uniformly along the total thickness of the PCB stackup. For example, these power planes may be placed at the upper layers of a PCB stackup. In such situations, power vias connecting all these power planes together may create a long via stub. The via stub of a power via can be referred to as a power via stub. These long power via stubs can cause degradation of signals carried by adjacent signal traces. When noise coupled into this power-plane setup reaches the power via stub, multi-reflections within the power via stub could generate a new set of noise on the power planes upon resonance, which in turn could be coupled into nearby signal traces routed on the PCB in areas underneath integrated circuit devices. The resonances can cause increased insertion loss and return loss and crosstalk of desired signals at the resonant frequencies. To mitigate such negative effects, according to some aspects of the instant application, the power via stubs can be removed or shortened by back-drilling. Back-drilling refers to the process of removing a portion of the plated metal on the inner surface of the through-hole by drilling a slightly larger hole from the backside of the PCB. By carefully controlling the depth of the back-drilling (e.g., to drill as close as possible to the power plane per fabrication tolerance), the power via stubs can be substantially eliminated. Note that in addition to drilling from a back surface of the PCB to remove the via stubs, depending on the configuration of the PCB, the drilling may also be carried out on the front surface. Back-drilling is a customary term and does not limit the operation of removing power via stubs to drilling from the back surface of the PCB. When back-drilling is not feasible, an additional power layer or power-supply shape (which comprises a continuous metal sheet covering a portion of a PCB layer and is connected to the power supply) can be added at the bottom layer of the PCB to terminate the power vias, thus effectively eliminating the power via stubs.

FIG. 1 illustrates a cross-sectional view of a multilayer PCB comprising a number of power vias, according to one aspect. Multilayer PCB 100 can include a plurality of conductive layers, including a top-surface layer (or a first surface layer) 102, a power-plane layer 104, a plurality of signal-plane layers (e.g., layers 106, 108, and 110), and a bottom-surface layer (or a second surface layer) 118. Adjacent conductive layers are separated by an insulator layer (e.g., layers 112, 114, and 116). For example, top-surface layer 102 and signal-plane layer 106 are separated by insulator layer 112, and power-plane 104 and signal-plane 108 are separated by insulator layer 116. Note that FIG. 1 shows that multilayer PCB 100 has more than seven conductive layers. In practice, multilayer PCB 100 can have any number of conductive layers.

Top-surface layer 102 and bottom-surface layer 118 are external layers onto which components can be mounted; some components may require power, and some may not. Power-plane layer 104 can include a continuous sheet of an electrically conducive material (e.g., copper) and can be connected to a power supply. The signal-plane layers (e.g., layers 106, 108, and 110) can include both signal-routing layers comprising copper traces for interconnecting components and reference-plane layers (i.e., ground layers) comprising a continuous sheet of an electrically conductive material. Power-plane layer 104 is typically situated close to the components requiring power.

PCB 100 can also include a plurality of plated through-hole (PTH) vias, which can be formed by drilling holes through all layers of the PCB and then copper plating the inner surface of the holes. In the example shown in FIG. 1, PCB 100 can include power vias 120 and 122 and signal vias 124 and 126. Each power via can be electrically connected (e.g., through a via pad, which typically can be a ring-shaped metal pad surrounding the via for connecting the inner layer of the via to traces or components on a PCB layer) to power-plane layer 104. For example, power via 120 is coupled to power plane 104 through a via pad 136, and power via 122 is coupled to power plane 104 through a via pad 138. A component mounted on top-surface layer 102 can draw power from power-plane layer 104 via a conductive trace connecting the component and a power via (e.g., power via 120 or 122). Signal vias allow signal traces (which are conductive traces carrying signals) on different layers to be connected to each other.

In the example shown in FIG. 1, bottom-surface layer 118 is not designed for mounting components that require power. Therefore, power vias 120 and 122 are only terminated at top-surface layer 102. For example, a first end of power via 120 can be connected, through via pad 128, to traces or component pins on top-surface layer 102, and a first end of power via 122 can be connected, through via pad 130, to traces or component pins on top-surface layer 102. Via pads 140 and 142 at a second end of power vias 120 and 122, respectively, remain open (i.e., they are not connected to anything). This means that each power via includes a significant via stub portion (referred to as a power via stub), which is the portion between power-plane layer 104 and bottom-surface layer 118. In certain situations, the power via stub portion can be more than 50% of the power via. In FIG. 1, power via 120 can include a power via stub 132, and power via 122 can include a power via stub 134. The length of each power via stub can be approximately the distance between power-plane layer 104 and bottom-surface layer 118, which can be between half a millimeter to a few millimeters. In situations where the components drawing power are mounted on the top surface of the PCB, the power plane can be placed near the top surface (e.g., abutting insulator layer 112). In the example shown in FIG. 1, counting from top-surface layer 102, the second conductive layer can be a ground-plane layer, and the third conductive layer is power-plane layer 104, which is relatively close to top-surface layer 102. When the power-plane layer is close to the top surface layer of the PCB, the length of each power via stub can be comparable to (e.g., slightly less than) the thickness of the PCB. For example, the length of a power via stub may be between 10% and 90% of the thickness of the PCB.

As can be seen from FIG. 1, a first end of a power via stub (e.g., stub 132 or 134) is connected to the power plane, and a second end of the power via stub is open, creating an open-circuit discontinuity. The resonance frequencies of the power via stub can depend on its dimension (e.g., length). For a typical high-density PCB with tens of layers, the resonance frequencies of the power via stub can be in the GHz range. For low-speed PCBs, resonance resulting from the power via stubs are typically outside of the spectrum range of signals carried by signal traces in the PCB (e.g., the signal spectrum can be below 1 GHz, whereas the resonance frequency is much higher than 1 GHz) and may not affect the signal integrity. However, for high-speed (e.g., 1 GHz and beyond) PCBs, resonance resulting from the power via stubs can fall within the signal spectrum. More specifically, for PCBs with a high via-density, a power via may be in close proximity (e.g., within a few millimeters) to a signal via (for example, power via 120 is adjacent to signal via 124), and energy can be coupled from the signal vias to the power vias, causing resonance within the power via stubs. The resonance signals can also be coupled into the signal traces, generating unwanted noises, or causing unwanted signal attenuation.

Figure 2A:
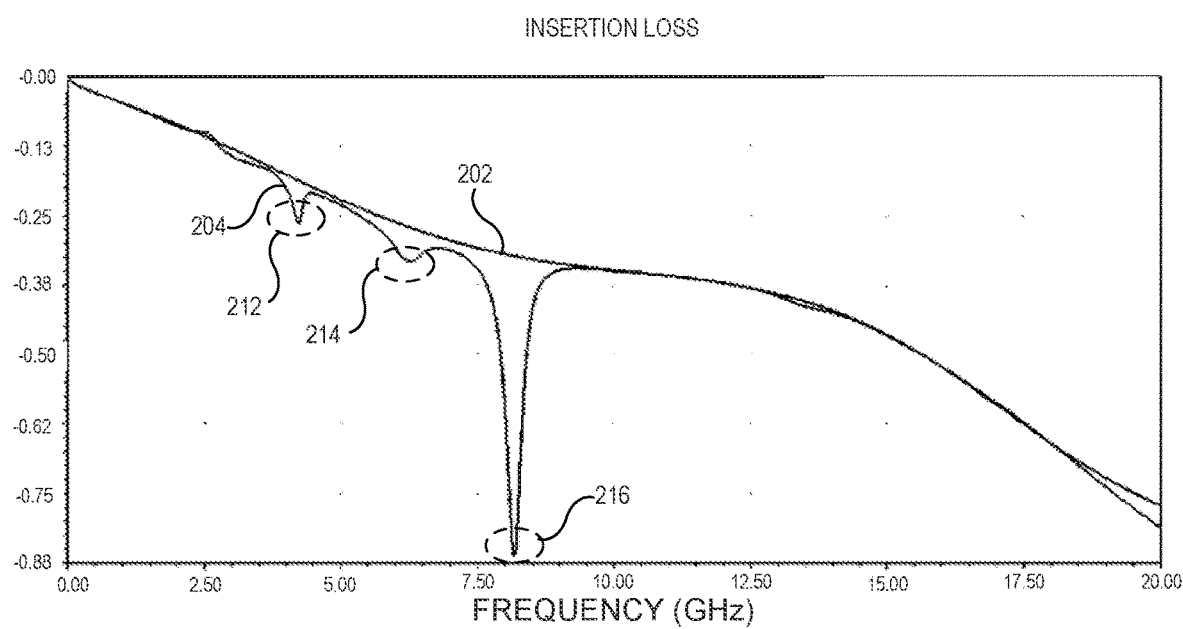
FIG. 2A illustrates insertion-loss simulation results for PCBs with and without power vias, according to one aspect.

To demonstrate the effect of the conventional power vias (e.g., power vias with a significant stub portion) on the signal quality, simulations have been run for PCBs with one or more power via structures or without the power via structures. FIG. 2A illustrates insertion-loss simulation results for PCBs with and without power vias (e.g., power vias as discussed with reference to FIG. 1), according to one aspect. In this example, high-frequency structure simulator (HFSS) simulations have been performed for an exemplary multilayer PCB (e.g., PCB 100 shown in FIG. 1). One HFSS simulation models the insertion loss of a signal trace in the PCB without considering the existence of a power plane and power vias (i.e., power plane 104 and power vias 120 and 122 shown in FIG. 1 are removed from PCB 100). The simulated insertion loss (represented by curve 202) shows no resonance. On the other hand, another HFSS simulation models the insertion loss of a signal trace in the PCB while considering the existence of the power plane and power vias (hence, power via stubs) (i.e., the simulation is carried out for PCB 100 with power plane 104 and power vias 120 and 122 in place). The simulated insertion loss (represented by curve 204) shows that resonances are present. More particularly, resonances on the insertion loss can be observed at approximately 4 GHz, 6 GHz, and 8 GHz (as indicated by dips 212, 214, and 216). These resonance frequencies can fall within the spectrum range of signals carried by the signal trace in a PCB board for high-speed applications. For example, the 5th generation of Peripheral Component Interconnect Express (PCIE-5) PCB may carry signals with a Nyquist frequency beyond 16 GHz. The resonances caused by the power via stubs can have a negative impact on the signal quality.

Figure 2B:
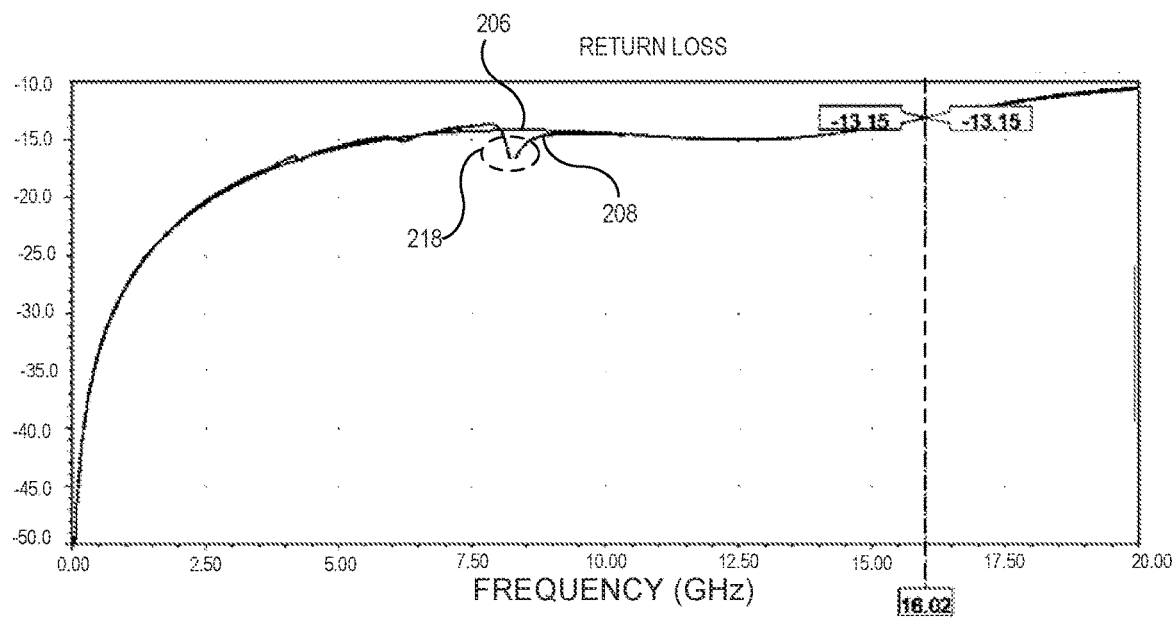
FIG. 2B illustrates return-loss simulation results for PCBs with and without power vias, according to one aspect.

FIG. 2B illustrates return-loss simulation results for PCBs with and without power vias, according to one aspect. Like what is shown in FIG. 2B, HFSS simulations can be performed for a PCB to obtain the return loss of a signal trace without considering the existence of the power plane and power vias (curve 206) and the return loss of the signal trace while considering the existence of the power plane and power vias (curve 208). As can be seen from FIG. 2B, the return loss also exhibits resonance behaviors (as indicated by a dip 218) when the power plane and power vias (hence, power via stubs) are considered.

As discussed previously, the resonance frequencies of a power via stub can depend on the dimension (e.g., length) of the power via stub. Therefore, different types of PCBs (e.g., PCBs with different numbers of layers) or the same type of PCBs but with different designs (e.g., different power plane locations) may have different power via resonance frequencies. For example, instead of the dip at about 8 GHz shown in FIG. 2A, the power via resonance may cause a dip of the transmitted signal at a different frequency (e.g., 7 GHz or 10 GHz). Regardless of the actual values of the power via resonance frequencies, as long as the power via resonance falls within the signal spectrum, the power via resonance will cause degradation of the transmitted signal.

To mitigate or reduce the negative effect on signal quality by the power via resonance, one approach is to eliminate all power via stubs by using a post-fabrication process, such as back-drilling.

Figure 3:
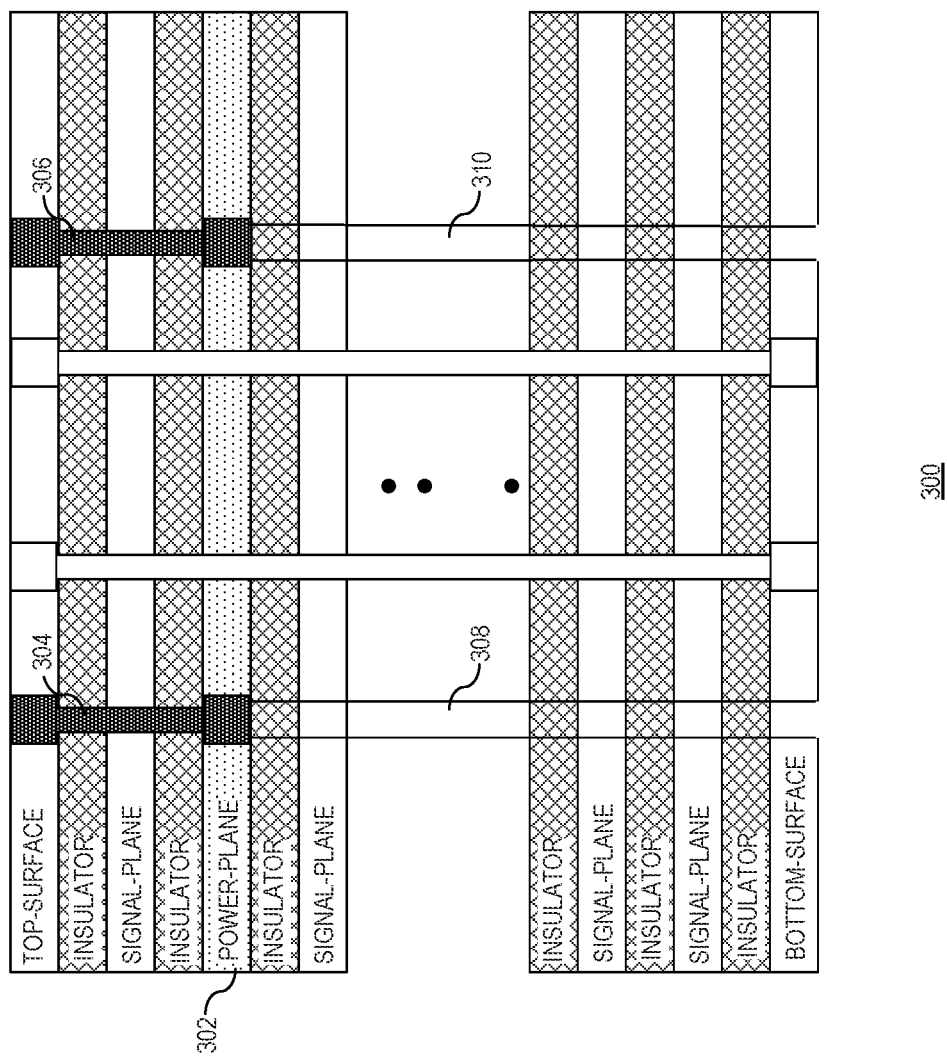
FIG. 3 illustrates a cross-sectional view of a multilayer PCB with its power via stubs removed, according to one aspect.

FIG. 3 illustrates a cross-sectional view of a multilayer PCB with its power via stubs removed, according to one aspect. In FIG. 3, a multilayer PCB 300 can include a plurality of conductive layers, such as a power-plane layer 302, a number of signal-plane layers, and top- and bottom-surface layers. Power-plane layer 302 can be connected to a power supply (not shown in FIG. 3) and can be responsible for providing power to components (not shown in FIG. 3) mounted on the top-surface layer of PCB 300.

PCB 300 can include a number of power vias (e.g., vias 304 and 306) for routing power from power-plane layer 302 to the components mounted on the top-surface layer of PCB 300. Compared with power vias 120 and 122 shown in FIG. 1, power vias 304 and 306 do not include via stubs (or alternatively have significantly shortened via stubs). More specifically, back-drilled holes 308 and 310 can be formed by drilling holes that have a slightly larger diameter compared with power vias 304 and 306. Note that back-drilling is a post-fabrication process and typically occurs after the PCB has been fabricated and before the components are mounted. During operation, a drill bit with a diameter slightly larger (e.g., 10-20% larger) than that of the through-hole can be selected and used to drill a hole along the longitudinal axis of the power via from the bottom surface of PCB 300, until the tip of the drill bit is sufficiently close to power-plane layer 302. In one example, the diameter of the power vias can be approximately 10 mils, and the diameter of the back-drilled holes can be approximately 12 mils or 0.3 millimeter.

In the example shown in FIG. 3, the back-drilling or the removing of the plated metal can reach power-plane layer 302 as close as possibly allowed by fabrication tolerance. This can result in a significantly reduced power via stub length (i.e., the length of the power via stub). According to some aspects, the reduced stub length can be less than 12 mils. Such short via stubs can be neglected, because their resonance frequencies can be much higher than frequencies in the signal spectrum. Note that, even if the back-drilling is not as accurate (e.g., the back-drilling stopped at one or more layers below power-plane layer 302), signal performance can still be improved. This is because the shortened via stubs (e.g., with a length between 10 and 30 mils) also have resonance frequencies beyond the signal spectrum.

In addition to back-drilling, other techniques can also be used to eliminate or reduce the power via stubs. According to some aspects, a sequential-lamination process can be used to produce a multilayer PCB. In such a scenario, depending on the location of the power plane, one can choose to plate or not plate the power via section in each PCB layer. When the multiple PCB layers are merged or laminated, the power vias can have a reduced stub length or have no stub as all.

In certain situations, back-drilling may be infeasible. For example, the power vias may each be connected to a capacitor at the bottom surface and back-drilling would destroy such connections. Therefore, an alternative to the back-drilling technique can be used to eliminate/reduce the power via stubs. According to some aspects, an additional power plane or power layer can be added (either at or close to the bottom surface) in the PCB to terminate the power vias.

Figure 4A:
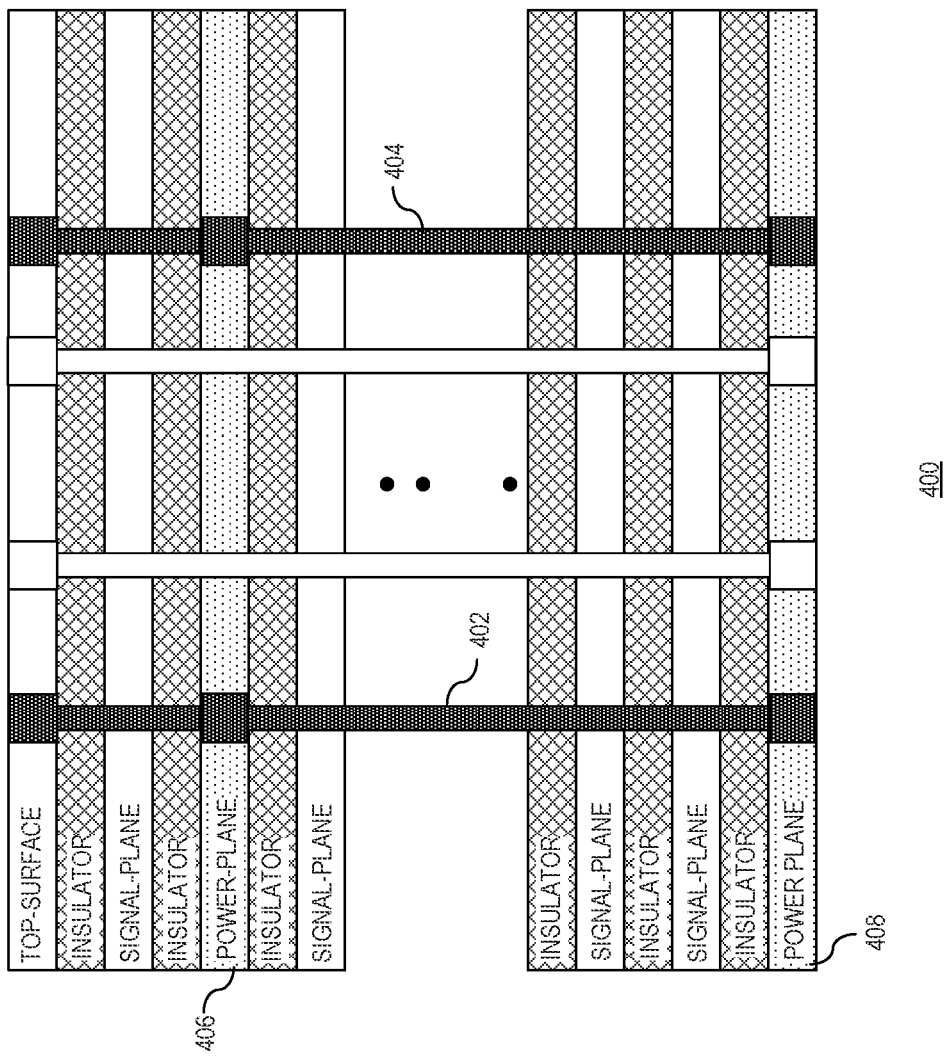
FIG. 4A illustrates a cross-sectional view of a multilayer PCB with an additional bottom power shape, according to one aspect.

FIG. 4A illustrates a cross-sectional view of a multilayer PCB with an additional bottom power, according to one aspect. In FIG. 4A, a multilayer PCB 400 can include a number of power vias (e.g., vias 402 and 404) that are PTH vias. PCB 400 can include a plurality of conductive layers, such as an internal power-plane layer (or a first power layer) 406, a number of signal-plane layers, and a top-surface layer. Components (not shown in FIG. 4A) requiring power can be mounted on the top-surface layer of PCB 400. Internal power-plane layer 406 can be connected to a power supply (not shown in FIG. 4A) and can be responsible for providing power to the components. Like what is shown in FIG. 1 and FIG. 3, internal power-plane layer 406 can be closer to the top surface than the bottom surface of PCB 400. For example, internal power-plane layer 406 can be the third conductive layer, counting from the top surface of the PCB.

In addition to internal power-plane layer 406, PCB 400 can include a bottom power-plane layer (or a second power layer) 408. In this example, bottom power-plane layer 408 can be a portion of the bottom-surface layer shown in FIG. 1 and FIG. 3. Bottom power-plane layer 408 can be connected to the same power supply that is connected to internal power-plane layer 406. In other words, internal power-plane layer 406 and bottom power-plane layer 408 are electrically connected to each other. This way, instead of an open circuit at the end of power vias 402 and 404, a short circuit is created, effectively terminating power vias 402 and 404. Compared with the open-circuit discontinuity, the short-circuit discontinuity at the end of the power vias can cause the resonance frequencies of the power via stubs to be in spectrum ranges outside of the effective spectrum of the signals carried by signal traces in PCB 400, thus improving the quality of those signals.

As discussed previously, the power vias may need to be connected to capacitors on the bottom surface or other components may be mounted on the bottom surface, thus making it impractical to incorporate the power plane into the bottom surface of the PCB. In such scenarios, a lower internal power-plane layer can be introduced to reduce the effective stub length of the power vias. This lower internal power-plane layer can be positioned as close as possible to the bottom surface layer.

Figure 4B:
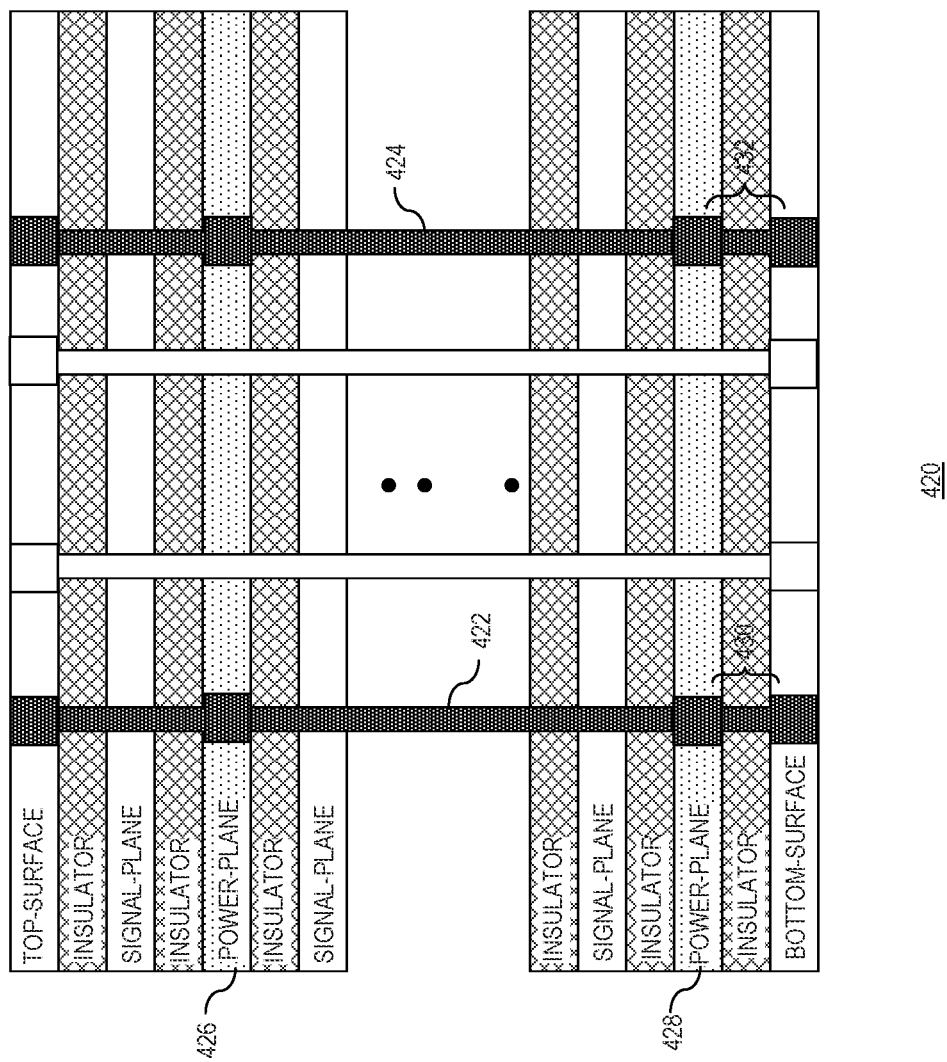
FIG. 4B illustrates a cross-sectional view of a multilayer PCB having an additional power-plane layer, according to one aspect.

FIG. 4B illustrates a cross-sectional view of a multilayer PCB having an additional power-plane layer, according to one aspect. In FIG. 4B, a multilayer PCB 420 can include a number of power vias (e.g., vias 422 and 424) that are PTH vias. PCB 420 can include a plurality of conductive layers, such as an internal power-plane layer 426, a number of signal-plane layers, and top- and bottom-surface layers. Components (not shown in FIG. 4B) requiring power can be mounted on the top surface of PCB 420. Internal power-plane layer 426 can be connected to a power supply (not shown in FIG. 4B) and can be responsible for providing power to the components. Like what is shown in FIG. 1 and FIG. 3, internal power-plane layer 426 can be closer to the top surface than the bottom surface of PCB 420. In this example, internal power-plane layer 426 is the third conductive layer, counting from the top.

In addition to internal power-plane layer 426, PCB 420 can include a lower power-plane layer 428, which is positioned close to the bottom surface of PCB 420. In this example, bottom power-plane layer 428 can be the second conductive layer, counting from the bottom of PCB 420. Although not shown in FIG. 4B, internal power-plane layer 426 and bottom power-plane layer 428 are connected to the same power supply. In other words, a short circuit is established between internal power-plane layer 426 and bottom power-plane layer 428. This can effectively terminate power vias 422 and 424 at bottom power-plane layer 428. Consequently, compared with the scenario shown in FIG. 1, the effective length of the power via stubs can be significantly reduced. In the example shown in FIG. 4B, power via 422 has a via stub 430, and power via 424 has a via stub 432. The length of each via stub can be approximately the distance between bottom power-plane layer 428 and the bottom surface of PCB 420. Compared with the scenario shown in FIG. 1, where the length of the power via stub can be similar to the distance between the internal power plane and the bottom surface, the stub length of each power via in FIG. 4B is significantly reduced (e.g., to less than 20 mils). As discussed previously, the reduced stub length means that the resonance frequencies of the power via stubs can be much higher than the upper edge of the signal spectrum. Consequently, the quality of the signals will not be affected by the power via resonance.

Figure 5A:
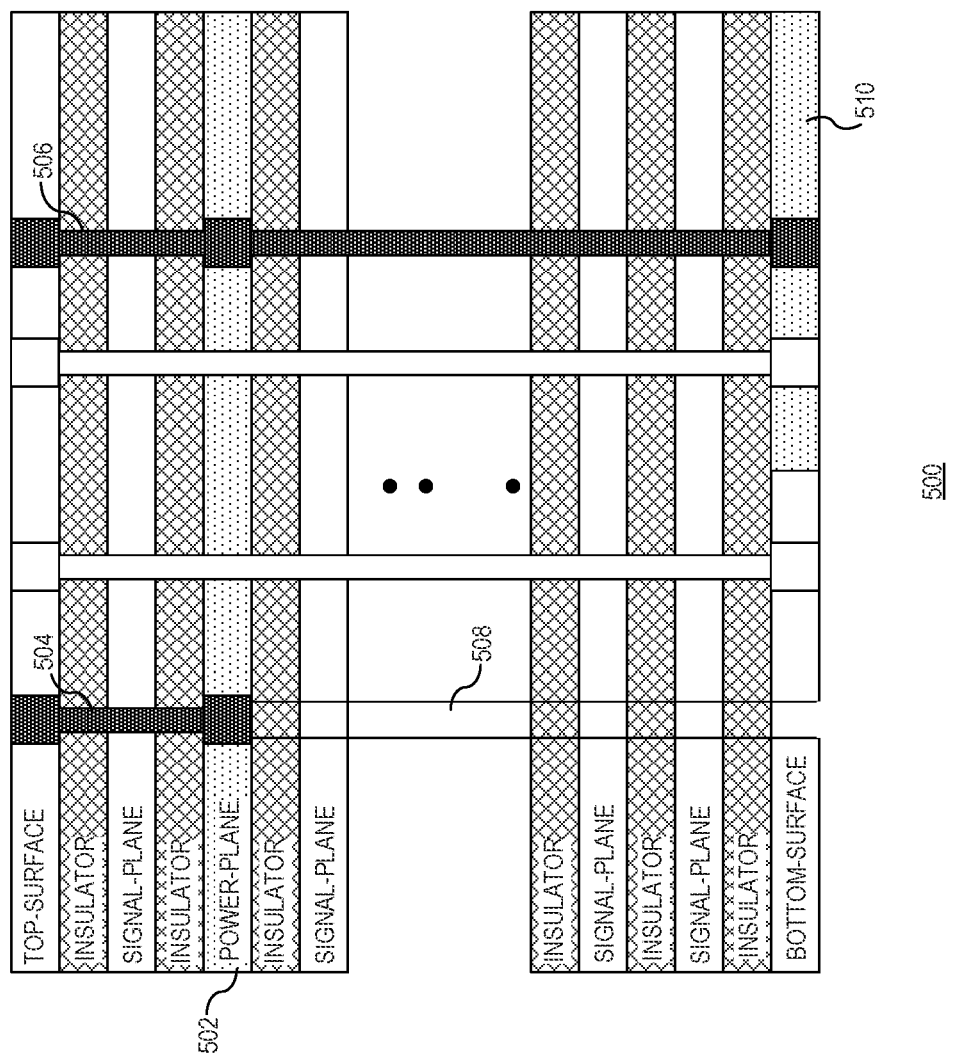
FIG. 5A illustrates a cross-sectional view of a multilayer PCB, according to one aspect.

In certain situations, among all power vias in a PCB, some power vias can have their associated via stubs eliminated/reduced by applying back-drilling, whereas other power vias can have their associated via stubs eliminated/reduced by being connected to a bottom power plane. FIG. 5A illustrates a cross-sectional view of a multilayer PCB, according to one aspect. In FIG. 5A, a multilayer PCB 500 can include a plurality of conductive layers, including a power-plane layer 502, a number of signal-plane layers, and top- and bottom-surface layers. Power-plane layer 502 can be connected to a power supply (not shown in FIG. 5A) and can be responsible for providing power to components (not shown in FIG. 5A) mounted on the top-surface layer of PCB 500.

PCB 500 can include a number of power vias (e.g., vias 504 and 506) for routing power from power-plane layer 502 to the components. More specifically, FIG. 5A shows that the via stub of power via 504 has been removed by back-drilling, and a back-drilled hole 508 is formed between power-plane layer 502 and the bottom-surface layer of PCB 500, along the longitudinal axis of power via 504. The diameter of back-drilled hole 508 can be slightly larger than the diameter of power via 504.

FIG. 5A also shows that the bottom-surface layer can include a power shape 510, which can include a continuous sheet of metal occupying a portion of the bottom-surface layer. Although not shown in FIG. 5A, power shape 510 and power-plane layer 502 are connected to the same power supply. In other words, a short circuit is created between power-plane layer 502 and power shape 510. Because the bottom end of power via 506 is connected to power shape 510, power via 506 is terminated and does not include a via stub. It is also possible that power shape 510 is not positioned in the bottom-surface layer but in one of the lower layers, such as a conductive layer next to the bottom-surface layer. Although this may not cause the complete or near-complete elimination of the stub of power via 506, the stub length can be significantly reduced (e.g., to less than 10 mils), and the resonance frequencies of power via 506 can be much higher than the upper edge of the signal spectrum, meaning that the power via resonance will not affect the signals.

Figure 5B:
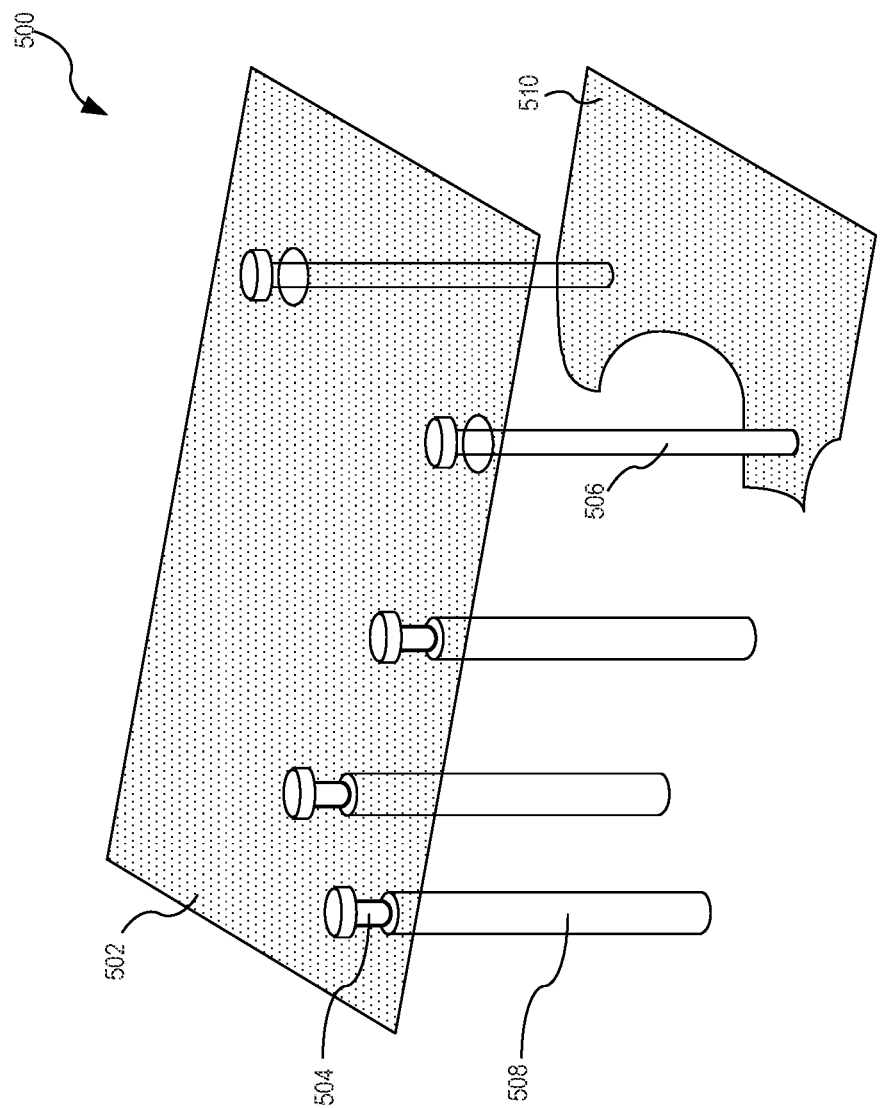
FIG. 5B illustrates a three-dimensional (3D) view of a multilayer PCB, according to one aspect.

FIG. 5B illustrates a three-dimensional (3D) view of multilayer PCB 500, according to one aspect. For simplicity of illustration, only power-plane layer 502 and power shape 510 on the bottom surface are shown in FIG. 5B, and other conductive and insulator layers are not shown. FIG. 5B also shows power via 504 and back-drilled hole 508 positioned between power via 504 and the bottom surface (not shown). As can be seen from FIG. 5B, back-drilled hole 508 is slightly larger than power via 504. On the other hand, power via 506 is not back-drilled, and its bottom end is connected to power shape 510.

Figure 6A:
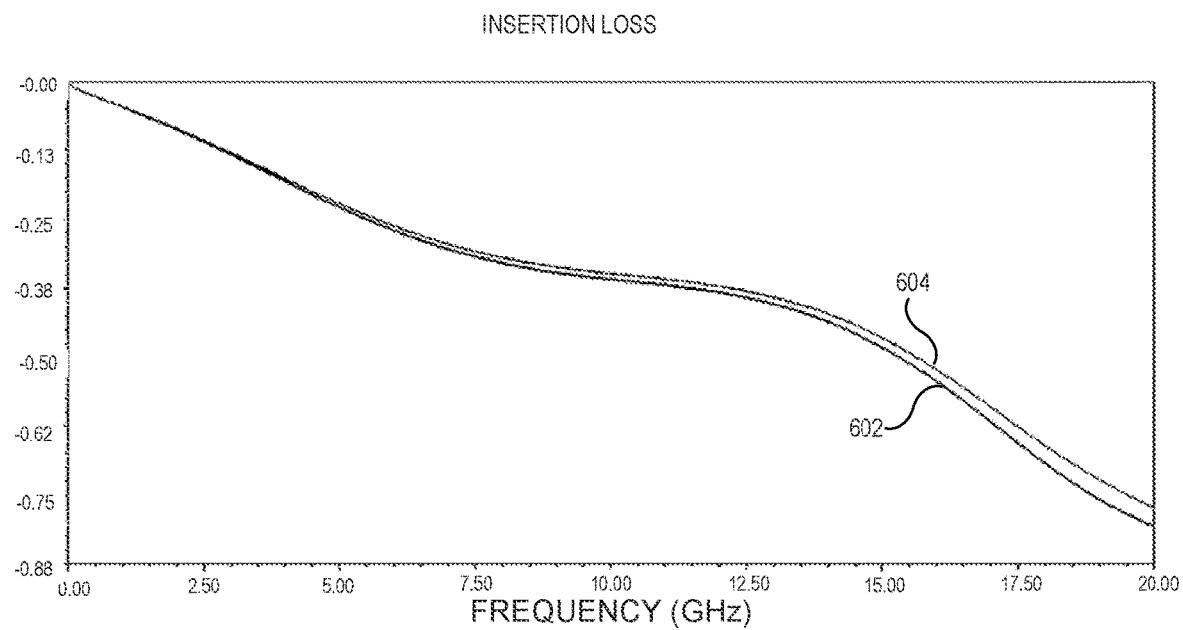
FIG. 6A illustrates insertion-loss simulation results for PCBs with removed or reduced power via stubs, according to one aspect.

FIG. 6A illustrates insertion-loss simulation results for PCBs with removed or reduced power via stubs, according to one aspect. In FIG. 6A, HFSS simulations are performed for an exemplary PCB with removed/reduced power via stubs to obtain the insertion loss as a function of frequency. The PCB can be similar to the ones shown in FIG. 3 through FIG. 5B. As can be seen in FIG. 6A, the simulated insertion loss for a PCB with removed/reduced power via stubs (represented by curve 602) can be similar to the simulated insertion loss for a PCB without power vias (represented by curve 604). More particularly, no power via resonance can be observed for the PCB with removed/reduced power via stubs.

Figure 6B:
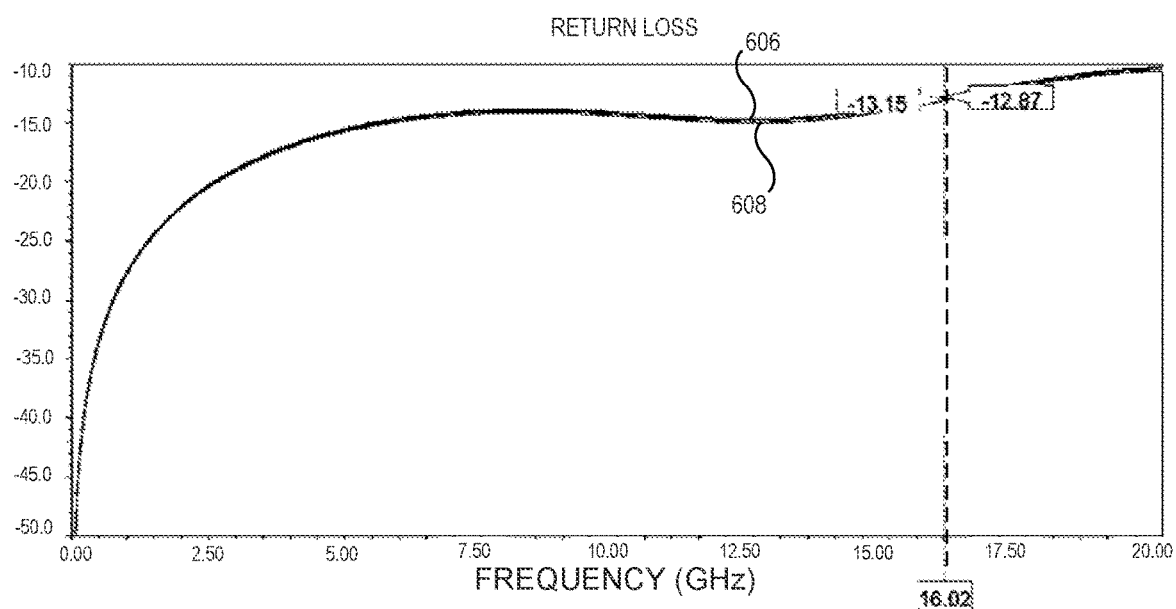
FIG. 6B illustrates return-loss simulation results for PCBs with removed or reduced power via stubs, according to one aspect.

FIG. 6B illustrates return-loss simulation results for PCBs with removed or reduced power via stubs, according to one aspect. In FIG. 6B, HFSS simulations are performed for an exemplary PCB with removed/reduced power via stubs to obtain the return loss as a function of frequency. The PCB can be similar to the ones shown in FIG. 3 through FIG. 5B. As can be seen in FIG. 6B, the simulated return loss of a PCB with removed/reduced power via stubs (represented by curve 606) can be similar to the simulated return loss of a PCB without power vias and power via stubs (represented by curve 608). In fact, curves 606 and 608 are almost overlapping, indicating that, once the via stubs are removed or reduced, the power vias will not cause additional signal reflections. In general, the results shown in FIGS. 6A-6B demonstrate that removing or reducing the power via stubs (either by back-drilling or by connecting them to an additional bottom power plane/shape) can remove power via resonances within the signal spectrum, thus improving the quality of signals carried by signal traces in the PCB.

Figure 7:
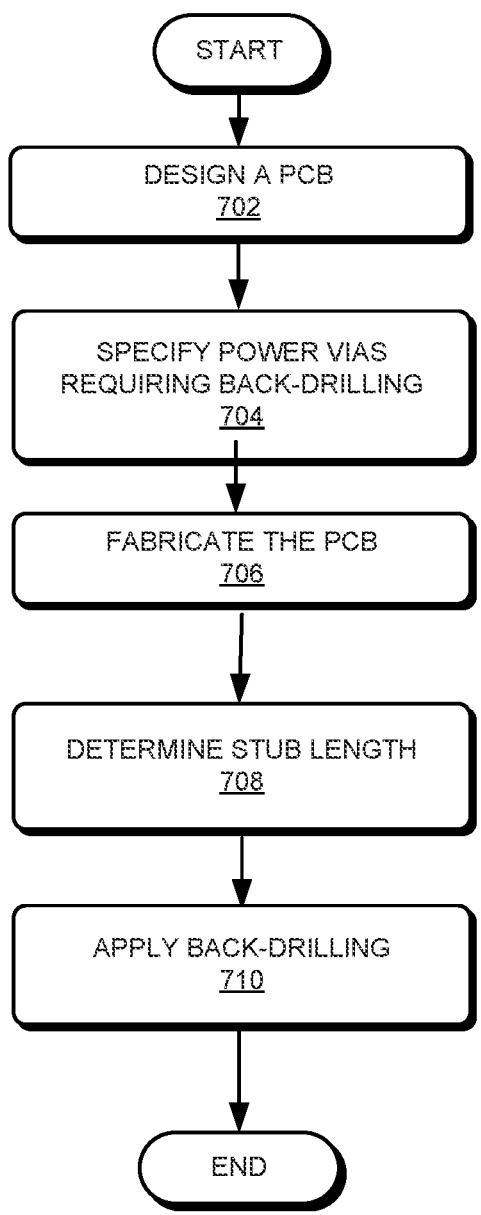
FIG. 7 presents a flowchart illustrating an exemplary process for removing/reducing power via stubs in a PCB, according to one aspect.

Connecting the second end of the power vias to an additional power plane/shape can be done during the PCB design. However, adding the bottom power plane or power shape may occupy precious PCB space. Back-drilling requires no additional board space but is a post-fabrication process that requires the precise control of the drilling depth. FIG. 7 presents a flowchart illustrating an exemplary process for removing/reducing power via stubs in a PCB, according to one aspect. During operation, a user can design a multilayer PCB (operation 702). The user can design the PCB using a standard PCB design tool. The multilayer PCB can include top and bottom surfaces, at least one power layer, and a plurality of power vias connected to the power layer. Note that in situations where a number of power vias cannot be back-drilled, the user may need to include, in the PCB design, an additional power layer/shape to connect to those power vias that cannot be back-drilled. The user can also specify, as part of the PCB design, a number of power vias needing to be back drilled post fabrication (operation 704). In addition to the aforementioned power vias that cannot be back-drilled, some power vias may be relatively far away from signal traces and do not need to be back-drilled. The PCB can then be fabricated using any known standard fabrication method (operation 706). The scope of the disclosure is not limited by the structure or fabrication means of the PCB. The PCB can include at least one power-plane layer and a number of power vias connected to the power-plane layer.

The user can determine the stub length of the identified power vias (operation 708). The typical stub length can be the distance between the power plane and the bottom surface of the PCB, and the user can obtain this measurement based on the layer structure of the PCB (e.g., the location of the power plane and the thickness of each layer).

Subsequently, a back-drilling process can be applied to those identified power vias to remove or reduce the length of the via stubs (operation 710). The back-drilling process removes a portion of the plated metal on the inner surface of the through-hole. By controlling the depth of the back-drilling (e.g., to set the back-drilling depth as close as possible to the determined length of the via stub), one can substantially remove the entire via stub or at least a significant portion of the via stub.

In general, the disclosure provides a solution to the problem of power via resonances in high-speed PCBs, where the resonance frequencies of power via stubs can fall within the spectrum range of signals carried by signal traces in the PCB. In such situations, the power via resonances may cause unwanted attenuation of desired signals. Removing or reducing the length of the power via stubs can mitigate the negative impact of the power via resonances on the desired signals. According to some aspects, the power via stubs can be removed or have their length reduced by applying post-fabrication back-drilling. According to alternative aspects, the power via stubs can be removed or have their length reduced by coupling the open end of the power vias to an additional power plane or power shape positioned near the bottom surface of the PCB (given that the components are mounted on the top surface of the PCB). In the examples shown in FIGS. 3-5B, each power plane extends through the entire layer. In practice, it is also possible to have split power planes, meaning that multiple (e.g., two, three, or more) power shapes can be formed within the same conductive layer, with each power shape connected to a separate power supply. If an additional power-plane layer is used to terminate the power vias, the additional power-plane layer should have similar split power planes, with corresponding power shapes on both power-plane layers coupled to the same power supply to short circuit the second end of the power vias.

One aspect provides a printed circuit board (PCB). The PCB can include a plurality of layers and a plurality of plated through-hole (PTH) vias extending through the plurality of layers. The plurality of layers can include at least a first surface layer for mounting components, a second surface layer, and a first power layer positioned between the first surface layer and the second surface layer. The plurality of PTH vias can include at least one power via coupled to the first power layer to provide power to components mounted on the first surface layer. A stub length of the power via can be less than a distance between the power layer and the second surface layer.

In a variation on this aspect, a portion of metal plated on an inner surface of the power via can be removed via back-drilling to reduce the stub length of the power via.

In a variation on this aspect, the PCB can further include a second power layer positioned between the first power layer and the second surface layer. The first and second power layers are coupled to a same power supply.

In a further variation, the power via can be coupled to the second power layer, thereby reducing the stub length of the power via.

In a further variation the second power layer can include a continuous sheet of metal that covers at least a portion of a layer of the PCB.

In a further variation, the plurality of PTH vias can include a first power via and a second power via, a portion of metal plated on an inner surface of the first power via can be removed via back-drilling, and the second power via can be coupled to the second power layer.

In a further variation, the second power layer can be positioned on the second surface layer.

In a variation on this aspect, the stub length of the power via can be less than 10% of the PCB's thickness.

One aspect provides a fabrication method. The method can include designing a multilayer PCB comprising a plurality of layers and a plurality of plated through-hole (PTH) vias extending through the plurality of layers. The plurality of layers can include at least a first surface layer for mounting components, a second surface layer, and a first power layer positioned between the first surface layer and the second surface layer. Designing the PCB can include specifying, among the plurality of PTH vias, at least a power via having an open end at the second surface layer of the PCB. The specified power via can be coupled to the first power layer to provide power to components mounted on the first surface layer. The method can include fabricating the designed PCB and performing a back-drilling process on the specified power via to reduce a stub length of the specified power via.

In a variation on this aspect, the stub length of the power via can be reduced to less than 12 mils.

In a variation on this aspect, designing the PCB can comprise including a second power layer positioned between the first power layer and the second surface layer. The first and second power layers are to be coupled to a same power supply.

In a further variation, designing the PCB can include designing a second power via coupled to the second power layer, thereby reducing the stub length of the second power via.

In a further variation, the second power layer can include a continuous sheet of metal that covers at least a portion of a layer of the PCB.

In a further variation, the second power layer can be positioned on the second surface layer.

In a variation on this aspect, performing the back-drilling process can further include determining the stub length of the power via and setting a depth of the back-drilling process to be approximately the determined stub length.

The foregoing descriptions of embodiments have been presented for purposes of illustration and description only. They are not intended to be exhaustive or to limit the scope of this disclosure to the forms disclosed. Accordingly, many modifications and variations will be apparent to practitioners skilled in the art.

What is claimed is:

1. A printed circuit board (PCB), the PCB comprising:
a plurality of layers; and
a plurality of plated through-hole (PTH) vias extending through the plurality of layers;
wherein the plurality of layers comprise at least a first surface layer for mounting components, a second surface layer, and first and second power layers positioned between the first surface layer and the second surface layer, the first and second power layers being short-circuited, and the second power layer being positioned closer to the second surface layer than the first power layer;

wherein the plurality of PTH vias comprise at least one power via to provide power to components mounted on the first surface layer, wherein the power via is electrically coupled to both the first and second power planes via a pair of via pads, causing a stub length of the power via being less than a distance between the first power layer and the second surface layer.

2. The PCB of claim 1, further comprising a second power via electrically coupled to the first power plane, wherein a portion of metal plated on an inner surface of the second power via is removed via back-drilling to reduce the stub length of the second power via.

3. The PCB of claim 1, wherein the second power layer comprises a continuous sheet of metal that covers at least a portion of a layer of the PCB.

4. The PCB of claim 1, wherein the second power layer is positioned on the second surface layer.

5. The PCB of claim 4, wherein the second power layer partially covers the second surface layer.

6. The PCB of claim 5, wherein the plurality of PTH vias comprise a first power via electrically coupled to the first power plane only and a second power via electrically coupled to both the first and second power planes, wherein the first power via is back drilled to remove a portion of metal plated on an inner surface of the first power via.

7. The PCB of claim 1, wherein the stub length of the power via is less than 12 mils.

8. The PCB of claim 1, wherein the second power layer is positioned on an inner layer of the PCB.

* * * * *